United States Patent

Owen

[15] 3,702,444

[45] Nov. 7, 1972

[54] VOLTAGE-CONTROLLED VARIABLE GAIN AMPLIFIER

[72] Inventor: Thomas P. Owen, New York, N.Y.

[73] Assignee: Columbia Broadcasting System, Inc.

[22] Filed: March 19, 1971

[21] Appl. No.: 125,994

[52] U.S. Cl.........................................330/28, 330/29

[51] Int. Cl.................................................H03g 3/30

[58] Field of Search ...330/28, 29, 145; 325/319, 413

[56] References Cited

UNITED STATES PATENTS

| | | | |
|---|---|---|---|
| R25,963 | 10/1959 | Heine et al | 330/145 X |
| 3,446,989 | 5/1969 | Ito | 330/145 X |
| 3,386,046 | 5/1968 | Myer | 330/29 |
| 3,351,867 | 11/1967 | Jamernik et al | 330/29 UX |

*Primary Examiner*—Roy Lake
*Assistant Examiner*—James B. Mullins
*Attorney*—Spencer E. Olson

[57] ABSTRACT

A transistorized voltage-controlled variable-gain audio amplifier including a transistor connected as a common-emitter amplifier, and a control circuit coupled to the emitter of the amplifying transistor and operative in response to a direct control signal to vary the impedance at the emitter without changing the voltage thereat. The control circuit includes a second transistor having matched collector and emitter resistors connected to a source of energizing potential and to ground respectively, and a branch circuit including at least two forward-biased semi-conductor diodes connected in series between the collector and emitter of the transistor. The junction between the diodes is connected through a capacitor to the emitter of the amplifying transistor thereby to effectively connect the impedance of the branch circuit in parallel with the emitter resistor of the amplifying stage. A direct control voltage applied to the base of the control transistor varies the current through the diodes to vary their impedance, and consequently the impedance at the emitter of the amplifying transistor, without changing the voltage at the emitter, to thereby vary the gain of the amplifying stage.

2 Claims, 1 Drawing Figure

PATENTED NOV 7 1972
3,702,444
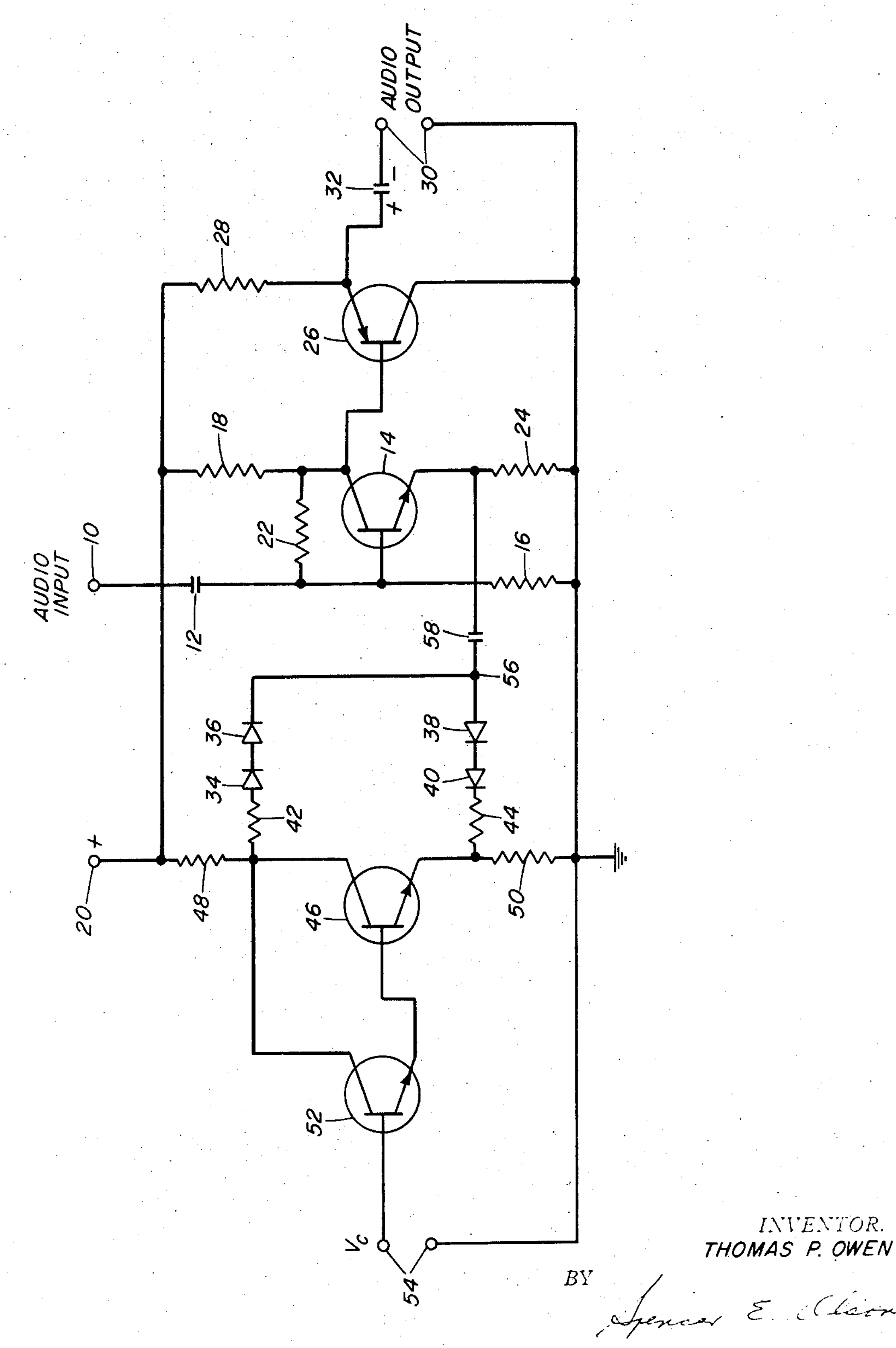
INVENTOR.
THOMAS P. OWEN
BY Spencer E. Olson
ATTORNEY

VOLTAGE-CONTROLLED VARIABLE GAIN AMPLIFIER

BACKGROUND OF THE INVENTION

Voltage-controlled variable gain amplifiers have been in long and widespread use, the control-voltage-versus-gain function having been achieved in a variety of ways including variable-gain vacuum tube circuits, variable-gain transistor circuits, and vario-losser circuits. Today such circuits are usually solid state, and are implemented in a variety of ways depending upon the desired control characteristics and the application in which they are to be used. In general, such circuits derive their control action by varying the current through a semiconductor device, such as a transistor or diode, in response to a control voltage to thereby vary the impedance of the device. Such circuits are usually of balanced configuration primarily to prevent feedthrough of the control signal to the amplifier stage. Such balanced circuits usually employ one or more transformers to achieve the necessary isolation which, or course, add to the cost and size of the circuit, making them less than desirable in applications requiring high quality performance at low equipment cost.

One such application of which applicant is aware is in the apparatus for decoding four separate channels of information transduced from a medium having only two tracks and presenting it on four loudspeakers to give the listener the illusion of sound coming from four separate sources described in co-pending application Ser. No. 44,224 filed June 8, 1970 and assigned to the assignee of the present invention. This system includes a decoder which accepts the two composite signals from the medium, which may be a disc record, and separates them into four independent channels each carrying predominantly the information contained in the respective original signals for presentation on four separate loudspeaker systems. To enhance the realism of the reproduction, the separate loudspeaker systems each include a gain-controlled amplifier. Logic and control circuitry associated with the decoder derives control signals from the decoded signals for controlling the gains of the individual amplifiers in the loudspeaker circuits. Inasmuch as the logic and control circuitry of this system also utilizes two gain-controlled amplifiers to develop the control signals, the overall system requires a total of six voltage-controlled variable gain amplifiers which, if the system is to be commercially attractive, must be relative inexpensive, and, moreover, in order to provide high quality performance in the audio range (e.g., 20 to 15,000Hz) over a wide range of sound levels, must provide a wide range of gain control with rapid response and negligible feedthrough of control voltage into the audio path.

Accordingly, it is a primary object of the present invention to provide a voltage-controlled variable gain audio amplifier having a wide range of gain control and fast response time and requiring a minimum of components so as to minimize the cost of manufacture.

SUMMARY OF THE INVENTION

Briefly, this object is attained in accordance with the invention by varying the impedance at the emitter electrode of a transistor in the audio amplifier stage in response to instantaneous variations in the current flowing in a pair of semiconductor diodes, which in turn, is varied by the applied control voltage. The circuit operates in a single-ended, or unbalanced, mode, requires no transformers and only a single power supply, and has a wide range of gain control.

DESCRIPTION OF THE DRAWINGS

Other features of the invention will become apparent, and its construction and operation will be better understood, from the following detailed description taken in conjunction with the accompanying drawing in which the single FIGURE is a schematic circuit diagram of a variable gain amplifier embodying the invention.

DESCRIPTION OF THE PREFERRED EMBODIMENT

Referring to the drawing, which illustrates the invention embodied in an audio amplifier, the audio signal to be amplified is applied at terminal 10 and coupled through a capacitor 12 to the base electrode of a transistor 14 connected as a common-emitter amplifier. That is, the base electrode is connected through resistor 16 to a point of reference potential, preferably ground, the collector electrode is connected through a resistor 18 to a source of positive DC potential represented by the terminal 20, which may, for example, have a value of 20 volts, and through a relatively larger resistor 22 to the base electrode, and the emitter is connected through resistor 24 to the point of reference potential, namely, ground. To lower the output impedance of the amplifier there is provided an emitter-follower stage which includes a transistor 26, the collector electrode of which is connected to ground, and the emitter of which is connected through resistor 28 to the potential source 20. The signal developed at the collector of transistor 14 is applied to the base electrode of transistor 26, and the output signal is coupled from the emitter of transistor 26 to the output terminal 30 via a capacitor 32.

Change in gain of the amplifier is effected by varying the impedance at the emitter of transistor 14 in response to a control voltage $V_c$. The impedance at this point is determined at any instant by the current flowing through diodes 34, 36, 38 and 40 connected in series in that order with each forward biased and in series with a pair of matched resistors 42 and 44 between the collector and emitter electrodes of a transistor 46, which is the output stage of a Darlington pair. The collector and emitter electrodes of transistor 46 are connected to potential source 20 and to ground through matched resistors 48 and 50, respectively, and the other transistor 52 of the Darlington pair has its collector and emitter electrodes connected to the collector and base electrodes, respectively, of transistor 46. The control voltage $V_c$ is applied at terminal 54 to the base electrode of transistor 52. The Darlington pair configuration is used because of its ability to eliminate the flow of base current in transistor 52 to thereby insure that the changes in potential at the collector and emitter of transistor 46 with changes in the value of $V_c$ are the same to thereby minimize the feedthrough of the control voltage. The use of matched resistors 48 and 50, preferably matched to within 1 percent, further minimizes the feedthrough of the control signals whereby the variations in potential at the collector and emitter of transistor 46 have equal magnitude and opposite polarity.

The current flow through diodes 34–40 is controlled by varying the current drawn by the Darlington pair 52, 46 in response to the control voltage $V_c$. As the current through transistors 52 and 46 is decreased with decreased $V_c$, the current through the diodes increases, thereby decreasing their impedance. The impedance of the diode branch is effectively placed in parallel with emitter resistor 24 by coupling the junction 56 between diodes 36 and 38 to the emitter of transistor 14 through a capacitor 58. This capacitor must be sufficiently large to shunt any AC signals appearing at the emitter of transistor 14 through the diodes and resistors 42, 44, 48 and 50 to A.C. ground. Thus, the emitter impedance of transistor 14 is decreased, thereby increasing its gain. Conversely, increasing the value of $V_c$ increases the current through the Darlington pair, decreases the current through the diode branch, causing the impedance of the diodes to increase, and, accordingly, the impedance at the emitter of transistor 14 also to be increased, thereby to decrease the gain of the amplifier stage. Thus, the impedance at point 56 is a direct function of the current flow through the four diodes, even though the potential at point 56 is held constant because of the equal and opposite voltage changes at the collector and emitter of transistor 46.

The circuit illustrated in the drawing having the following components and values exhibited a range of gain control of approximately 60 dB, with maximum gain (+10 dB) obtained with $V_c = 10$ volts and minimum gain (−50 dB) obtained with $V_c = 10.8$ volts. The control-voltage-versus-gain (in decibels) characteristic was approximately linear over the entire control range, and it was possible to vary the gain at any rate from D. C. to greater than 60 dB/millisecond with negligible feedthrough of control voltage into the audio path.

| | |
|---|---|
| Transistors **45** and **52** | 2N3393 |
| Diodes **34, 36, 38** and **40** | In456(matched) |
| Transistor **14** | 2N3393 |
| Transistor **26** | 2N3906 |
| Resistors **48** and **50** | 887 ohms (1%) |
| Resistors **42** and **44** | 2K ohms (1%) |
| Resistor **16** | 1.5 megohms |
| Resistor **18** | 120K ohms |
| Resistor **24** | 470K ohms |
| Resistor **22** | 510 ohms |
| Resistor **28** | 5.1K ohms |
| Capacitor **58** | 1.6 microfarads |
| Capacitor **12** | 1 microfarad |
| Capacitor **32** | 1.6 microfarads |
| Potential source **20** | 20 volts DC |

It will, of course, be understood that the above listed components and circuit values are by way of example only, and that transistors and diodes of other types, or integrated circuits capable of performing the functions of the illustrated discrete components, may be used without departing from the spirit of the invention.

While the invention has been described as embodied in a voltage-controlled variable gain audio amplifier, the circuit is also particularly well suited to AGC applications because of its wide control range and fast response time.

I claim:

1. A voltage-controlled variable-gain amplifier system comprising, in combination, an amplifier stage including a first transistor having a base, an emitter and a collector, means to apply an input signal to the base of said first transistor relative to ground, a first resistor connected between the emitter of said first transistor and ground, a second resistor connected between the collector of said first transistor and a source of direct current potential, a control transistor having a base, an emitter and a collector, a third resistor connected between the emitter of said control transistor and ground, a fourth resistor having a resistance substantially equal to the resistance of said third resistor connected between the collector of said control transistor and said source of direct current potential, a branch circuit including a fifth resistor, at least first and second forward-biased semi-conductor diodes, and a sixth resistor having a resistance substantially equal to the resistance of said fifth resistor, connected in series in the order named between the collector and the emitter of said control transistor, a capacitor connected solely between the junction of said first and second diodes and the emitter of said first transistor, whereby the impedance of said branch circuit is effectively connected in parallel with said first resistor, and means to apply a direct control voltage to the base of said control transistor to vary the current through said diodes and thereby the impedance at the emitter of said first transistor, without changing the voltage thereat thereby to vary the gain of said amplifier stage.

2. Apparatus in accordance with claim 1 wherein said branch circuit further includes a third forward-biased semi-conductor diode connected between said fifth resistor and said first diode and a fourth forward-biased semi-conductor diode connected between said second diode and said sixth resistor, a third transistor having a base, an emitter and a collector, means directly connecting the emitter of said third transistor to the base of said control transistor, means directly connecting the collector of said third transistor to the collector of said control transistor, and means to apply said direct control voltage to the base of said third transistor.

* * * * *